(12) United States Patent
Zheng et al.

(10) Patent No.: US 7,537,046 B2
(45) Date of Patent: May 26, 2009

(54) HEAT DISSIPATION DEVICE WITH HEAT PIPE

(75) Inventors: Dong-Bo Zheng, Shenzhen (CN); Lei Cao, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/695,462

(22) Filed: Apr. 2, 2007

(65) Prior Publication Data

US 2008/0236798 A1 Oct. 2, 2008

(51) Int. Cl.
*F28D 15/00* (2006.01)
*H05K 7/20* (2006.01)
(52) U.S. Cl. .................... 165/80.3; 165/104.21
(58) Field of Classification Search ............ 165/80.3, 165/104.21, 104.33, 104.34; 361/697, 700; 174/15.2, 16.3; 257/715
See application file for complete search history.

(56) References Cited

U.S. PATENT DOCUMENTS

| 6,625,021 | B1 | | 9/2003 | Lofland et al. | |
|---|---|---|---|---|---|
| 7,059,391 | B2 | * | 6/2006 | Whitney | 165/104.33 |
| 2004/0226697 | A1 | * | 11/2004 | Liu | 165/104.33 |
| 2005/0141198 | A1 | * | 6/2005 | Lee et al. | 361/700 |
| 2006/0289150 | A1 | * | 12/2006 | Lee et al. | 165/104.33 |
| 2007/0000645 | A1 | * | 1/2007 | Tung et al. | 165/104.26 |
| 2007/0000646 | A1 | * | 1/2007 | Chen et al. | 165/104.33 |
| 2007/0012428 | A1 | * | 1/2007 | Wu et al. | 165/104.33 |
| 2007/0044944 | A1 | * | 3/2007 | Lin | 165/104.33 |
| 2007/0051501 | A1 | * | 3/2007 | Wu et al. | 165/104.33 |
| 2007/0095509 | A1 | * | 5/2007 | Lee et al. | 165/104.33 |

* cited by examiner

*Primary Examiner*—Tho v Duong
(74) *Attorney, Agent, or Firm*—Frank R. Niranjan

(57) ABSTRACT

A heat dissipation device includes a base (10) for thermally engaging with an electronic device and a plurality of fins (320) arranged on the base (10). A heat pipe (52) thermally connects the fins (320) and the base (10) for transferring heat from the base (10) to the fins (320). The heat pipe (52) comprises an evaporation section (521) sandwiched between the base (10) and the fins (320), two condensation sections (525, 526) parallel to the evaporation section (521) and thermally engaging with the fins (320), and two connecting sections (527, 528) interconnecting corresponding condensation sections (525, 526) and the evaporation section (521). The connecting sections (527, 528) form an included angle therebetween. The condensation sections (525, 526) are spaced from and extend toward each other.

3 Claims, 3 Drawing Sheets

HEAT DISSIPATION DEVICE WITH HEAT PIPE

BACKGROUND OF THE INVENTION

1. Field of the Invention

The present invention relates to heat dissipation devices, and particularly to a heat dissipation device having a heat pipe for cooling an electronic component, such as an integrated circuit package.

2. Description of Related Art

During operation of an electronic device such as a computer central processing unit (CPU), a large amount of heat is often produced. The heat must be quickly removed from the CPU to prevent it from becoming unstable or being damaged. Typically, a heat dissipation device is attached to an outer surface of the CPU to absorb the heat from the CPU. The heat absorbed by the heat dissipation device is then dissipated to ambient air.

Conventionally, a heat dissipation device comprises a solid metal base attached to the CPU, and a plurality of fins arranged on the base. The base is intimately attached to the CPU thereby absorbing the heat generated by the CPU. Most of the heat accumulated on the base is transferred firstly to the fins and then dissipates away from the fins. However, as electronics technology continues to advance, increasing amounts of heat are being generated by powerful state-of-the-art CPUs. As a result, many conventional heat dissipation devices are no longer able to effectively remove heat from these CPUs.

In order to overcome the above set out problems, one type of heat dissipation device used with the electronic devices includes a heat pipe for transferring heat from one part of the heat dissipation device to another. A heat pipe is a vacuum-sealed pipe that is filled with a phase changeable material, usually being a liquid, such as water, alcohol, acetone or the like, and has an inner wall thereof covered with a capillary configuration. As the electronic device heats up, a hot section (usually called an evaporating section) of the heat pipe, which is located close to the electronic device, also heats up. The liquid in the evaporating section of the heat pipe evaporates and the resultant vapor reaches a cool section (usually called a condensing section) of the heat pipe and condenses therein. Then the condensed liquid flows to the evaporating section along the capillary configuration of the heat pipe. This evaporation/condensation cycle repeats and since the heat pipe transfers heat so efficiently, the evaporating section is kept at or near the same temperature as the condensing section of the heat pipe. Correspondingly, heat-transfer capability of the heat dissipation device including such a heat pipe is greatly improved.

A heat dissipation device may incorporate a plurality of heat pipes. The heat dissipation device further comprises a base for contacting an electronic device and a plurality of fins arranged on the base. The base defines a plurality of grooves therein. The fins cooperatively define a plurality of through holes therein. Each heat pipe is generally U-shaped and has a substantially straight evaporating section received in a corresponding groove of the base, a straight condensing section received in a corresponding through hole of the fins. The heat generated by the electronic device is absorbed by the base, and transferred from the base to the fins via the heat pipes, and finally dissipated from the fins to ambient air. However, in order to improve heat dissipation efficiency of the heat dissipation device, the number of the heat pipes is increased, which accordingly increases the cost of the heat dissipation device.

What is needed, therefore, is a heat dissipation device which has a greater heat-transfer capability whilst remaining economical to produce. More specifically, the present invention is aimed to enhance the heat dissipation capability of the heat dissipation device without increasing the number of the heat pipes.

SUMMARY OF THE INVENTION

A heat dissipation device in accordance with a preferred embodiment of the present invention removes heat from an electronic device. The heat dissipation device comprises a base for thermally engaging with the electronic device and a plurality of fins arranged on the base. A heat pipe thermally connects the fins and the base for transferring heat from the base to the fins. The heat pipe comprises an evaporation section sandwiched between the base and the fins so as to thermally connect them, two condensation sections parallel to the evaporation section and thermally engaging with the fins, and two connecting sections interconnecting corresponding condensation sections and evaporation section. The connecting sections extend upwardly and slantwise from two opposite ends of the evaporation section. An included angle is formed between the two connecting sections. The condensation sections are located above the evaporation section, spaced from each other, and parallel to evaporation section. The condensation sections extend from the connecting sections along directions toward each other.

Other advantages and novel features of the present invention will become more apparent from the following detailed description when taken in conjunction with the accompanying drawings.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
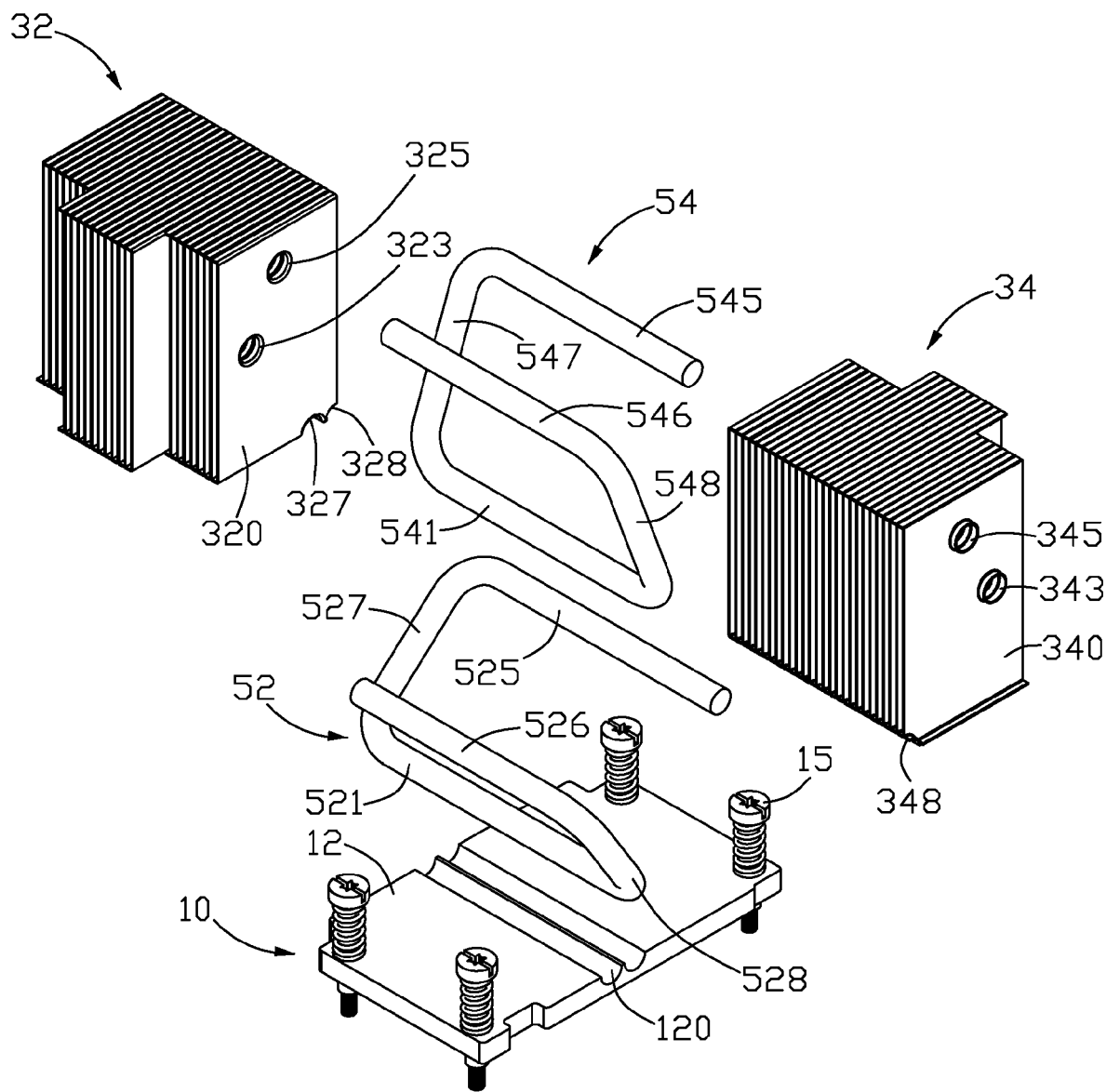
FIG. 1 is an exploded, isometric view of a heat dissipation device in accordance with a preferred embodiment of the present invention.

Referring to FIG. 1, a heat dissipation device of a preferred embodiment of the invention comprises a base 10, a first fin assembly 32 and a second fin assembly 34 arranged on the base 10, two heat pipes 52, 54 thermally connecting the base 10 and the fin assemblies 32, 34.

The base 10 is a substantially rectangular metal plate having good heat conductivity, and has a bottom face (not labeled) for contacting with an electronic device (not shown) on a printed circuit board (not shown) and a top face 12 on an opposite side to the bottom face. A pair of adjoining grooves 120 are defined in the base 10 at the top face 12 for receiving the heat pipes 52, 54 therein. The grooves 120 are parallel to each other. The base 10 thermally engages with the electronic device mounted on the printed circuit board (not shown) by extending four fasteners 15 through four corners (not labeled) thereof. The four fasteners 15 are used to extend through the printed circuit board (not shown) and threadedly engage with a back plate (not shown) on a bottom of the printed circuit board (not shown).

The first fin assembly 32 comprises a plurality of fins 320. Two opposite corners (not labeled) of one side of the first assembly 32 are cut away to define two receiving spaces for receiving the fasteners 15. Each fin 320 is substantially rectangular and made from a metal sheet. The fins 320 of the first fin assembly 32 define two through holes 323, 325 for receiving the heat pipe 52, 54 therein. The fins 320 define two adjoining slots 327, 328 at a bottom thereof. Flanges (not labeled) perpendicularly extend from bottom edges, top edges and the through holes 323, 325 of the fins 320. The flanges separate the fins 320 at uniform intervals.

The second fin assembly 34 comprises a plurality of fins 340. Two opposite corners (not labeled) of one side of the first assembly 34 are cut away to define two receiving spaces for receiving the fasteners 15. Each fin 340 is substantially rectangular and made from a metal sheet. The fins 340 of the first fin assembly 34 define two through holes 343, 345 for receiving the heat pipe 52, 54 therein. The fins 340 define a slot 348 at a bottom thereof. The slots 327, 328 of the fins 320, the slot 348 of the fins 340 and the grooves 120 of the base 10 cooperatively define two channels (not labeled) for receiving the heat pipes 52, 54 when first fin assembly 32 and the second fin assembly 34 are stacked together and mounted onto the base 10. Flanges (not labeled) perpendicularly extend from bottom edges, top edges and the through holes 343, 345 of the fins 340. The flanges separate the fins 340 at uniform intervals.

The heat pipe 52 comprises an evaporation section 521, two condensation sections 525, 526 and two connecting sections 527, 528 interconnecting corresponding condensation sections 525 and the evaporation section 521. The two connecting sections 527, 528 extend upwardly and slantwise from opposite ends of the evaporation section 521 and at an angle to each other. An acute inclined angle is formed between the connecting sections 527, 528. The two condensation sections 525, 526 extend from free ends of the two connecting sections 527, 528 along directions toward each other. The two condensation sections 525, 526 are substantially parallel to each other and substantially parallel to the evaporation section 521 and the base 10. The heat pipe 54 has a configuration substantially similar to the heat pipe 52, and comprises an evaporation section 541, two condensation sections 545, 546 and two connecting sections 547, 548 interconnecting corresponding condensation sections 545, 546 and the evaporation section 541. An included angle between the connecting sections 547, 548 is smaller than that between the connecting sections 527, 528. The two condensation sections 545, 546 are positioned above the two condensation sections 525, 526, respectively.

Figure 2:
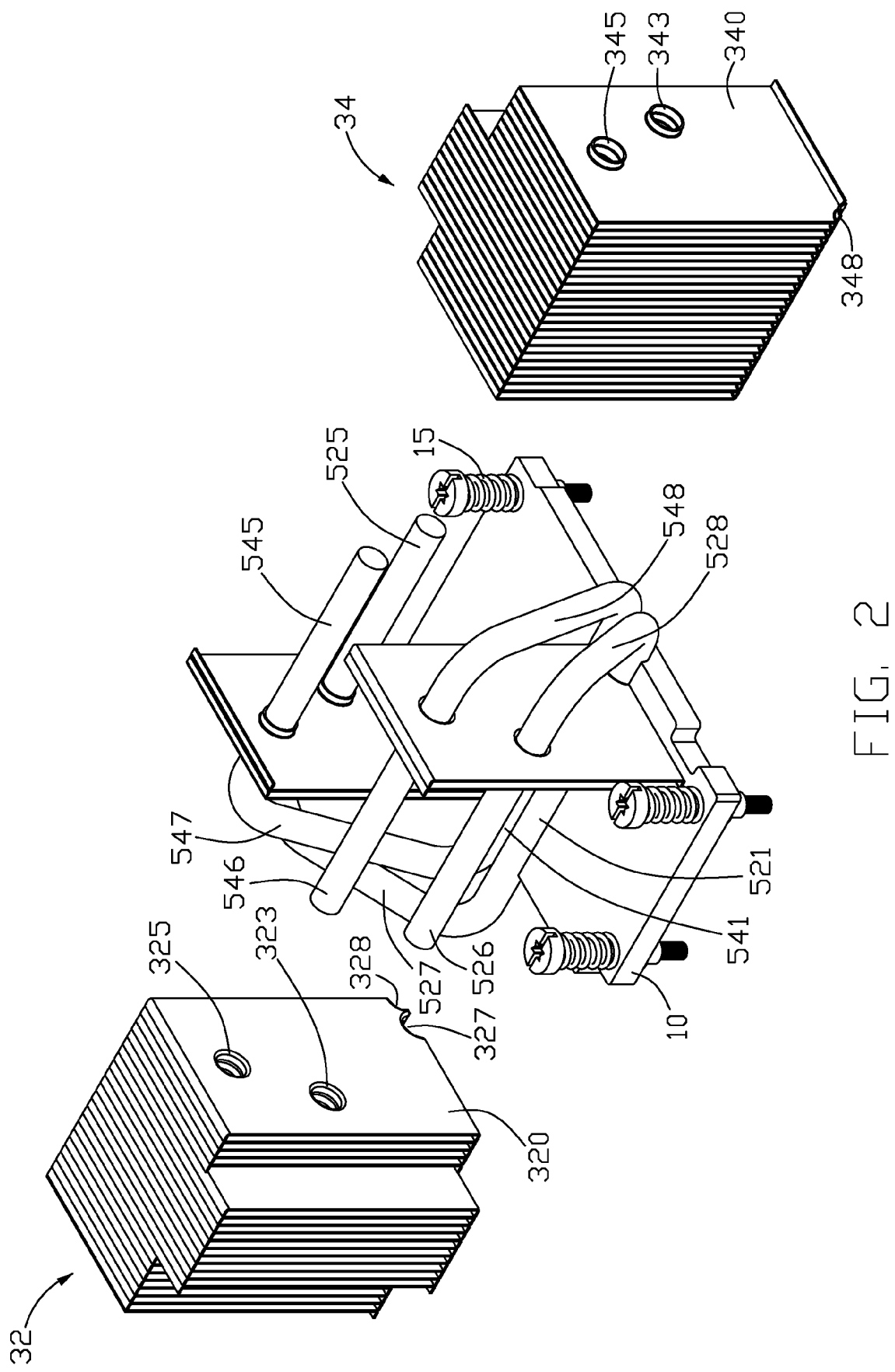
FIG. 2 is a partially assembled view of FIG. 1.
Figure 3:
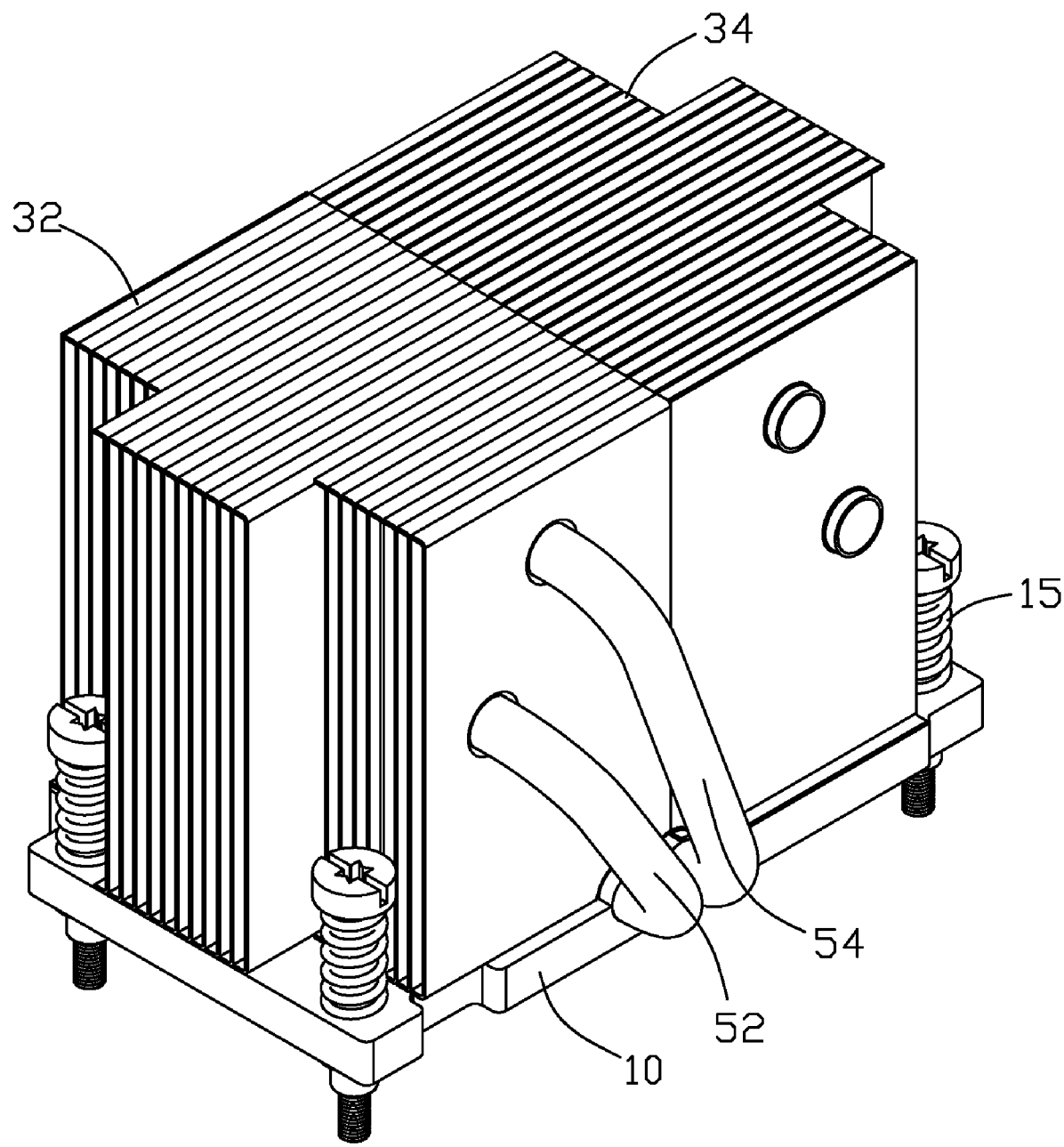
FIG. 3 is an assembled view of FIG. 1.

Referring also to FIGS. 2 and 3, the evaporation sections 521, 541 of the heat pipe 52, 54 are accommodated in the grooves 120 of the base 10. The fins 320, 340 are thermally arranged on the top face 12 of the base 10, with the evaporation sections 521, 541 of the heat pipe 52, 54 being thermally received in the slots 327, 328 of the fins 320 and the slot 348 of the fins 340 thereof. The condensation sections 526, 546 of the heat pipes 52, 54 extend through corresponding through holes 323, 325 of the fins 320. The other condensation sections 525, 545 of the heat pipes 52, 54 extend through corresponding through holes 343, 345 of the fins 340.

In use of the heat dissipation device of this embodiment of the invention, the base 10 absorbs heat from the electronic device to which the base 10 is attached. A portion of the heat in the base 10 is absorbed by the evaporation sections 521, 541 of the heat pipes 52, 54 and is then transferred to the fins 320, 340 via the connecting sections 527, 528, 547, 548 and the condensation sections 525, 526, 545, 546 of the heat pipes 52, 54. The other portion of the heat in the base 10 is directly transferred to the fins 320, 340 via direct contact. The heat in the fins 320, 340 is subsequently dissipated to ambient air. In the present invention, since each heat pipe has two spaced, parallel condensation sections engaging with the fins, the two heat pipes of the present invention can function generally equal to four U-shaped heat pipes regarding the heat transferring capability. Thus, the present invention can enhance the heat dissipation capability of the heat dissipation device without increasing the number of the heat pipes. Accordingly, cost of the heat dissipation device according to the present invention can be lowered, in comparison with a conventional heat dissipation device having the same heat dissipation capability.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
    a base for thermally engaging with a heat-generating electronic component;
    first and second fin assemblies mounted on the base;
    a first heat pipe having an evaporation section mounted on the base and thermally connecting therewith, condensation sections extending through the first and second fin assemblies, respectively, and connecting sections interconnecting the evaporation section and the condensation sections;
    a second heat pipe having an evaporation section mounted on the base and thermally connecting therewith, condensation sections extending through the first and second fin assemblies, respectively, and connecting sections interconnecting the evaporation section and the condensation sections of the second heat pipe, wherein the condensation sections of the first heat pipe are located above the condensation sections of the second heat pipe;
    wherein the condensation sections of the first heat pipe are separated from each other and extend toward each other, the condensation sections of the second heat pipe are separated from each other and extend toward each other, and the first and second fin assemblies are separate from each other; and
    wherein a first included angle is formed between the connecting sections of the first heat pipe and a second included angle is formed between the connecting sections of the second heat pipe, the first included angle being smaller than the second included angle.

2. The heat dissipation device as described in claim 1, wherein the first included angle is formed by a plane defined by one of the connecting sections and the evaporation section of the first heat pipe and a plane defined by another one of the connecting sections and the evaporation section of the first heat pipe, and the second included angle is formed by a plane defined by one of connecting sections and the evaporation section of the second heat pipe and a plane defined by another one of the connecting sections and the evaporation section of the second heat pipe.

3. The heat dissipation device as described in claim 1, wherein the evaporation section of the second heat pipe is parallel to the evaporation section of the first heat pipe.

* * * * *